US007608905B2

(12) United States Patent
Bratkovski et al.

(10) Patent No.: US 7,608,905 B2
(45) Date of Patent: Oct. 27, 2009

(54) INDEPENDENTLY ADDRESSABLE INTERDIGITATED NANOWIRES

(75) Inventors: Alexandre Bratkovski, Mountain View, CA (US); Amir A. Yasseri, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 219 days.

(21) Appl. No.: 11/581,969

(22) Filed: Oct. 17, 2006

(65) Prior Publication Data

US 2008/0090401 A1 Apr. 17, 2008

(51) Int. Cl.
*H01L 21/4763* (2006.01)

(52) U.S. Cl. ....................... 257/461; 257/419; 257/463; 257/465; 257/466; 257/E21.001; 257/E21.409; 257/E21.581; 257/E23.144; 257/E23.167; 257/E51.033; 257/E51.04; 438/20; 438/57; 438/82; 438/88; 438/672; 977/742; 977/936; 977/948

(58) Field of Classification Search ............ 257/E51.04, 257/192, 236, 252, 253, 288, 419, 461–466, 257/E21.001, 409, 581, E23.144, 167, E31.073; 438/20, 57, 71, 81, 82, 88, 618, 637, 672; 977/742, 936, 948
See application file for complete search history.

(56) References Cited

U.S. PATENT DOCUMENTS 6,231,744 B1 5/2001 Ying et al.
6,852,920 B2 * 2/2005 Sager et al. ................. 136/263
6,858,521 B2 2/2005 Jin
6,914,279 B2 * 7/2005 Lu et al. ....................... 506/39
6,946,597 B2 * 9/2005 Sager et al. ................. 136/263
7,073,157 B2 * 7/2006 DeHon et al. ................. 716/17
7,229,909 B2 * 6/2007 Furukawa et al. ........... 438/622
7,385,295 B2 * 6/2008 Son et al. .................... 257/776
7,462,890 B1 * 12/2008 Tombler et al. ............. 257/192
2004/0075464 A1 4/2004 Samuelson et al.
2004/0079278 A1 4/2004 Kamins et al.
2004/0082178 A1 4/2004 Kamins et al.
2005/0066883 A1 3/2005 Dubrow et al.
2006/0021647 A1 * 2/2006 Gui et al. ..................... 136/252
2006/0038990 A1 2/2006 Habib et al.
2006/0138575 A1 6/2006 Kamins et al.
2007/0054421 A1 * 3/2007 Ueda et al. ..................... 438/3
2008/0017236 A1 * 1/2008 Perlo et al. .................. 136/201
2008/0157363 A1 * 7/2008 Mayya Kolake et al. .... 257/741
2009/0053512 A1 * 2/2009 Pyun et al. .................. 428/336
2009/0098671 A1 * 4/2009 Kim et al. ..................... 438/20
2009/0166686 A1 * 7/2009 Hunt et al. .................. 257/288

OTHER PUBLICATIONS

Eugenia, M. et al., "Preparation of a Single Metal Wire by Electrochemical Filling of an Etched Ion Track", downloaded Oct. 17, 2006.
Islam, M.S. et al., "A Novel Interconnection Technique for Manufacturing Nanowire Devices", Appl. Phys., Mar. 2005.
Islam, M.S. et al., "Ultrahigh-Density Silicon Nanobridges Formed Between Two Vertical Silicon Surfaces", IOP Publishing Ltd, Jan. 2004.
Muhlschlegel, P. et al., "Resonant Optical Antennas", www.sciencemag.org, vol. 308, Jun. 2005.
Shashank, S. et al., "Controlled Metal-Catalyzed Growth of Silicon Nanowire for Device Integration", Nov. 2005.
Spacedaily, www.spacedaily.com/news/nanotech-02h.html., "Growing Nanowires By The Branch", Mar. 2002.

* cited by examiner

*Primary Examiner*—Michael S Lebentritt

(57) ABSTRACT

An apparatus has multiple sets of independently addressable interdigitated nanowires. Nanowires of a set are in electrical communication with other nanowires of the same set and are electrically isolated from nanowires of other sets.

20 Claims, 13 Drawing Sheets

INDEPENDENTLY ADDRESSABLE INTERDIGITATED NANOWIRES

FIELD

The embodiments disclosed herein generally relate to nanowires, and more particularly to independently addressable interdigitated nanowires.

BACKGROUND

Nanoscale dipole antennas have been fabricated to be resonant at optical frequencies. Because optical antennas link propagating radiation and confined/enhanced optical fields they have found applications in optical characterization, manipulation of nanostructures, optical information processing, and other electrical applications.

However, the precision required for nanometer-scale manufacturing has limited the ability of nanoscale dipole antennas. This is because individual dipole antennas lack the efficiency and sensitivity needed to render them useful in real-world applications, and current fabrication techniques do not allow a large number of dipole nanowire antennas to be disposed in a small region. Thus, the creation of a high density dipole antenna array is not possible with current techniques.

SUMMARY

An apparatus including multiple sets of nanowires is disclosed herein. The apparatus may include a first set of nanowires and a second set of nanowires interdigitated with the first set of nanowires. The first set of nanowires may be independently addressable from the second set of nanowires. In addition, the first set of nanowires may be electrically isolated from the second set of nanowires.

BRIEF DESCRIPTION OF THE DRAWINGS

Various features of the embodiments can be more fully appreciated, as the same become better understood with reference to the following detailed description of the embodiments when considered in connection with the accompanying figures.

DETAILED DESCRIPTION

Figure 1:
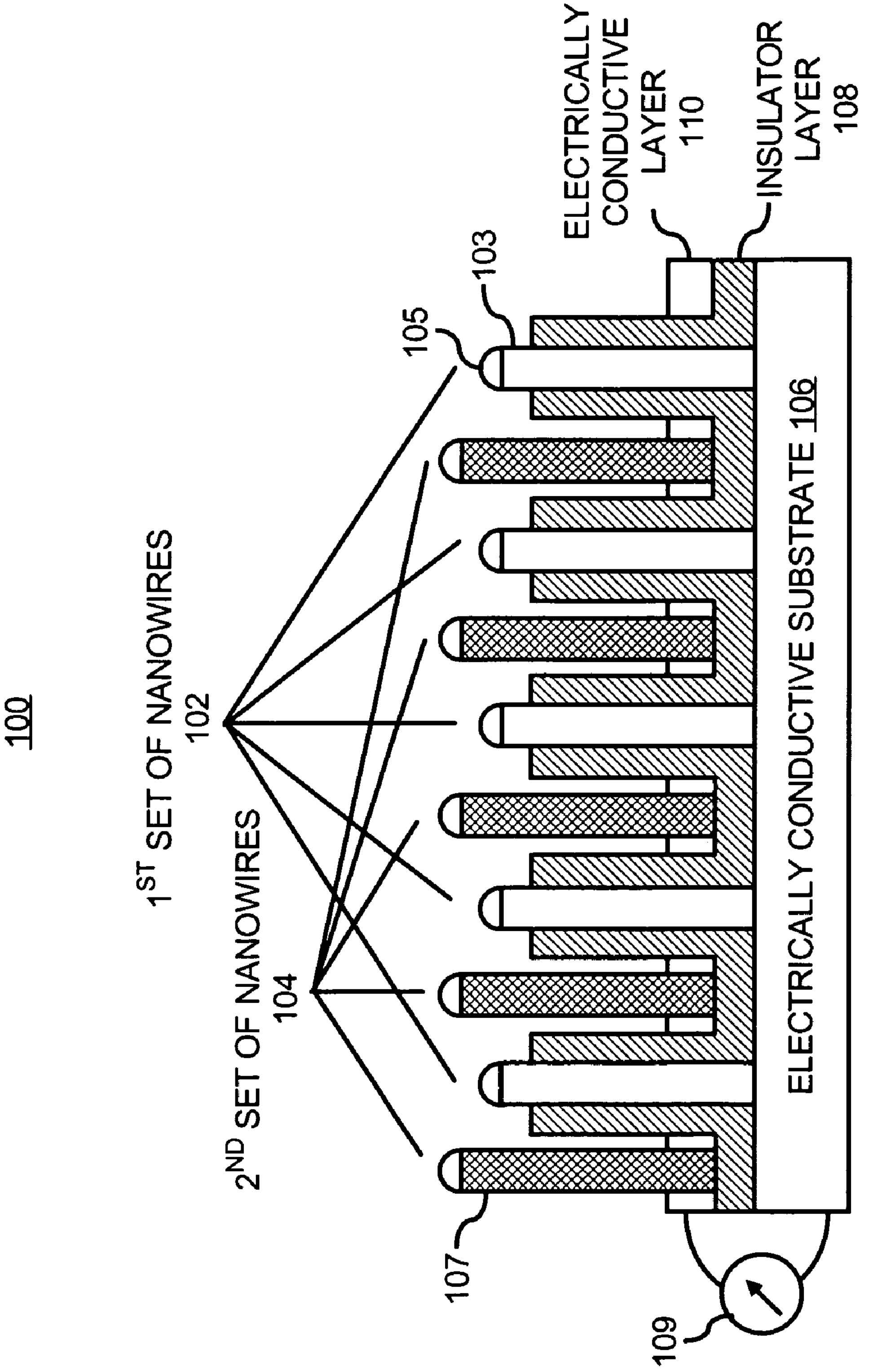
FIG. 1 illustrates an apparatus having two sets of independently addressable interdigitated nanowires, according to an embodiment of the invention.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

An apparatus having multiple sets of interdigitated nanowires, where each set of nanowires is independently addressable from each other set of nanowires is disclosed. A set of nanowires refers to at least two nanowires, which are in electrical communication with each other. Electrical communication may be defined to include that the same electric current may flow to both a first nanowire and a second nanowire in the same set of nanowires.

The apparatuses described herein contain at least two sets of nanowires, where each set may allow a separate and independent electrical current to flow through the set. Therefore, the sets of nanowires are independently addressable, which generally indicates that one set of nanowires may be addressed without addressing another set of nanowires. The term "address" generally refers to any contact or communication with a set of nanowires. For example, one set of nanowires may be induced to conduct an electric current, while another set of nanowires may be induced to conduct another electric current. The two sets of nanowires may be insulated from each other, or otherwise electrically isolated from each other, such that the electric current is substantially prevented from flowing from one set of nanowires to another set of nanowires, to thereby substantially prevent electric shunting between the two sets of nanowires.

In another example, independently addressing sets of nanowires may include monitoring one set of nanowires without monitoring another set of nanowires on the same apparatus. Alternatively, both sets of nanowires may be monitored simultaneously to receive independent readings from each set of nanowires.

The term "interdigitated" may be defined to include that the two sets of nanowires are commingled with each other. The sets of nanowires may be interdigitated with each other in any geometrical pattern, configuration, or spatial relationship, as will be described in greater detail below. For example, one set of nanowires may be interwoven with another set of nanowires in an alternating "one-for-one" pattern.

The term "nanowire", as used herein, generally refers to a nanostructure characterized by at least one, and preferably at least two physical dimensions that are less than about 500 nm, preferably less than about 200 nm, more preferably less than about 150 nm or 100 nm, and most preferably less than about 50 nm or 25 nm or even less than about 10 nm or 5 nm. Nanowires typically have one principle axis that is longer than the other two principle axes and consequently have an aspect ratio greater than one, more preferably an aspect ratio greater than about 10, still more preferably an aspect ratio greater than about 20, and most preferably an aspect ratio greater than about 100, 200, or 500 nm.

The nanowires may have any reasonably suitable length and, in certain embodiments, the nanowires may range in length from about 10 nm to about 100 μm, from about 20 nm to about 20 μm, from about 100 nm to about 10 μm, or from about 20 nm or 50 nm to about 500 nm. In addition, the nanowires may have a length less than about 1 μm, less than about 500 nm, less than about 250 nm, or less than about 100 nm.

The nanowires may have any reasonably suitable diameter and may typically have diameters ranging from about 5 to 200 nm. Although precise uniformity of the diameters of the nanowires is not required, in certain embodiments, nanowires may have a substantially uniform diameter, such that essentially no substantial tapering or modulation of the diameter occurs along the length of the nanowire. In particular embodiments, the diameter may have a variance less than about 20%, more preferably less than about 10%, still more preferably less than about 5%, and most preferably less than about 1% over the region of greatest variability and over a linear dimension of at least 5 nm, preferably at least 10 nm, most preferably at least 20 nm, and most preferably at least 50 nm. The diameter of the nanowire may be adjusted to provide any desired surface to volume ratio for optimum detection by controlling the diameter of the metal nanoparticles used to form the nanowires. In addition, the lengths and diameters of the nanowires may be varied to alter the radiative power and/or the overall power and impedance of the nanowire antenna driven at a certain frequency. The dimensions of the nanowires may also be influenced by a masking pattern when forming nanowires by a top-down or deposition method.

In certain embodiments, the nanowires may be substantially crystalline and/or substantially monocrystalline. The nanowires may be substantially homogeneous in material, or in certain embodiments may include heterogeneous materials. Essentially, any reasonably suitable material or combination of materials may be used to form the nanowires. Particularly preferred nanowires include semiconductive and metallic nanowires. Semiconductor and metallic materials may include, but are not limited to, Si, Ge, InP, GaAs, GaN, GaP, InAs, Sn, Se, Te, Au, B, Diamond, P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, $(Cu,Ag)(Al,Ga,In,Tl\ Fe)(S,Se\ Te)_2$, $Si_3N_4$, $Ge_3N_4$, $Al_2O_3$, $(Al,Ga,In)_2(S,Se,Te)_3$, $Al_2CO$, Sc, Y, Ti, Zr, Hf, and/or an appropriate combination of two or more such materials.

The nanowires may comprise pure materials, substantially pure materials, be single crystalline, substantially crystalline, non-crystalline, amorphous, crystalline combined with an amorphous or semiamorphous domain, doped materials and the like, and may include insulators, conductors, and semiconductors. Where the nanowires are doped, any particular doped region may act/function as though it is homogeneously doped with respect to its electrical, and/or optical, and/or magnetic, and/or thermal properties.

Nanowires may be created by any reasonably suitable top-down or bottom up method of fabrication, including chemical vapor deposition (CVD), modified chemical vapor deposition (MOCVD), vapor-liquid-solid (VLS), electrodeposition, electroless deposition, etc., techniques. By way of a bottom up example, metal nanoparticles may be formed and grown on a substrate. The formation and growth of metal nanoparticles on semiconductor substrates is known, and is disclosed, for example, in U.S. patent application Ser. No. 10/281,678, filed Oct. 28, 2002, to Kamins et al., and U.S. patent application Ser. No. 10/690,688, filed Oct. 21, 2003, to Kamins et al., the contents of both of which are incorporated herein by reference in their entireties.

Nanowires may also be formed horizontally such that they bridge two terminals, such as two electrodes. Suitable methods of forming bridging nanowires are disclosed, for example, in U.S. patent application Ser. No. 11/022,123 filed Dec. 23, 2004, to Kamins et al., Islam, Saif M., "Ultrahigh-Density Silicon Nanobridges Formed Between Two Vertical Silicon Surfaces," Nanotechnology 15, L5-L8 (Jan. 23, 2004), and Islam, Saif M., "A Novel Interconnection Technique For Manufacturing Nanowire Devices," Appl. Phys. A80, 1133-1140, Mar. 11, 2005, all of which are incorporated herein by reference in their entireties.

FIG. 1 illustrates a partial cross-sectional side view of an apparatus 100 having two sets of interdigitated nanowires, 102, 104, where the sets of nanowires 102, 104 are independently addressable and electrically isolated from each other, according to an embodiment. Some of the elements in FIG. 1 are depicted with different types of shading to better distinguish the different elements from each other. In addition, the apparatus 100 may include additional components and some of the components described herein may be removed and/or modified without departing from a scope of the apparatus 100.

As shown in FIG. 1, the first set of nanowires 102 and the second set of nanowires 104 are interdigitated with each other in a regular "one for one" alternating pattern across the horizontal axis of the apparatus 100. That is, each nanowire 103 of the first set of nanowires 102 is depicted as being adjacent to a nanowire 107 of the second set of nanowires 104. This spatial configuration is depicted as repeating in a regular pattern. However, it should be understood that the first and second sets of nanowires 102 and 104 may be interdigitated in any regular or irregular manner or pattern.

In other embodiments, therefore, two nanowires 103 of the first set of nanowires 102 may be adjacent to each other in one section of the apparatus 100, while three or more nanowires 103 of the first set of nanowires 102 may be adjacent to each other in another section of the apparatus 100. Similarly, the nanowires 103, 107 of both the first and second sets of nanowires 102 and 104 may be any distance from each other and the distances between nanowires 103, 107 may be substantially consistent or varied.

According to the embodiment depicted in FIG. 1, the first set of nanowires 102 extends from an electrically conductive substrate 106. The electrically conductive substrate 106 may be any reasonably suitable material, which conducts an electric current and may be a substantially homogenous material or a heterogeneous material comprising any reasonably suitable combination of materials. The electrically conductive substrate 106 may be similar to the material that makes up the first set of nanowires 102. For example, the electrically conductive substrate 106 may be silicon or doped silicon, germanium or doped germanium, or the electrically conductive substrate 106 may comprise a metal.

In addition, the electrically conductive substrate 106 may be provided in any reasonably suitable dimensions, including any reasonably suitable length, width, and thickness. While the electrically conductive substrate 106 has been depicted in FIG. 1 as a single layer, the electrically conductive substrate 106 may include multiple layers without departing from a scope of the apparatus 100.

The electrically conductive substrate 106 generally allows the nanowires 103 of the first set of nanowires 102 to be in electrical communication with each other. That is, an electric current may flow from one nanowire 103 of the first set of nanowires 102 to all the other nanowires 103 of the first set of nanowires 102 by virtue of the fact that all of the nanowires 103 of the first set of nanowires 102 are in physical connection with the electrically conductive substrate 106.

As also shown in FIG. 1, an insulator layer 108 is provided on the electrically conductive substrate 106. The insulator layer 108 may be any reasonably suitable material, which inhibits the flow of an electric current. The insulator layer 108 may be a substantially homogenous material or a heterogeneous material comprising any reasonably suitable combination of materials. For example, the insulator layer 108 may be silicon dioxide, aluminum oxide, or the like.

The insulator layer 108 of the apparatus 100 coats portions of the nanowires 103 of the first set of nanowires 102 and may deposited through, for instance, CVD, PVD, ALD, electrodeposition, etc. Portions of the nanowires 103 of the first set of nanowires 102 refers to any portion of the nanowires 103 of the first set of nanowires 102, including, for example, the entire outer circumference of the nanowires 103 of the first set of nanowires 102 or any lesser portion thereof. Because FIG. 1 is a cut-away, partially cross-sectional view of the apparatus 100, the insulator layer 108 coating the entire circumference of the nanowires of the first set of nanowires 102 is not illustrated. However, portions of the terminal ends 105 of the nanowires 103 of the first set of nanowires 102, opposite the electrically conductive substrate 106, are not coated by the insulator layer 108.

As mentioned above, the apparatus 100 includes a second set of nanowires 104, which are disposed on the insulator layer 108. The second set of nanowires 104 may be substantially similar to the nanowires 103 of the first set of nanowires 102 in that they may be formed from the same materials or combination of materials. Alternatively, however, the nanowires 107 of the second set of nanowires 104 may be dissimilar from the nanowires 103 of the first set of nanowires 102.

In any regard, the nanowires 107 of the second set of nanowires 104 may extend beyond the height of the nanowires 103 of the first set of nanowires 102, because the second set of nanowires 104 may have substantially similar physical dimensions as the nanowires of the first set of nanowires 102; however, the second set of nanowires 104 extends from a different vertical level than the first set of nanowires 102. Alternatively, however, the physical dimensions of the second set of nanowires 104 may be different from the first set of nanowires 104. For example, the second set of nanowires 104 may be reduced in height to render both sets of nanowires 102 and 104 to be substantially equivalent in height.

The apparatus 100 includes an electrically conductive layer 110 disposed on the insulator layer 108. The electrically conductive layer 110 may be any reasonably suitable material or combination of materials capable of facilitating the flow of an electric current. The electrically conductive layer 110 may be the same material as the electrically conductive substrate 106 or may be different from the electrically conductive substrate 106. In this regard, the electrically conductive layer 110 may be silicon or doped silicon, germanium or doped germanium, or the electrically conductive substrate 110 may comprise a metal.

The electrically conductive layer 110 allows the nanowires 107 of the second set of nanowires 104 to be in electrical communication with each other. That is, an electric current may flow from one nanowire 107 of the second set of nanowires 104 to all the other nanowires 107 of the second set of nanowires 104 by virtue of the fact that all the nanowires 107 of the second set of nanowires 104 are in physical contact with the electrically conductive layer 110.

However, the second set of nanowires 104 is independently addressable from the first set of nanowires 102, because the nanowires 103 of the first set of nanowires 102 are coated with the insulation layer 108 and, therefore, are not in physical contact or electrical communication with the second set of nanowires 104. In addition, therefore, the nanowires 103 of the first set of nanowires 102 are electrically isolated from the nanowires 107 of the second set of nanowires 104.

The first and second sets of nanowires 102 and 104 may be brought into electrical communication by an external device 109. The external device 109 includes any material or instrument capable of facilitating an electrical connection between the first and second sets of nanowires 102 and 104, thereby allowing an electric current to pass between the first and second sets of nanowires 102 and 104. The external device 109 may also include any device capable of measuring an electrical property of the first and second set of nanowires 102 and 104. Other devices, such as driving power sources, amplifiers, analyzers, etc. may also be used in conjunction with the apparatus 100. The apparatus 100 may, for instance, include a computer or any device used in probe stations.

Although the electrically conductive layer 110 has been illustrated in FIG. 1 as being deposited after deposition or growth of the nanowires 107, according to another embodiment, the electrically conductive layer 110 may be deposited on the insulator layer 108 prior to deposition or growth of the nanowires 107 without departing from a scope of the apparatus 100. This embodiment is disclosed in greater detail herein below.

Figure 2A:
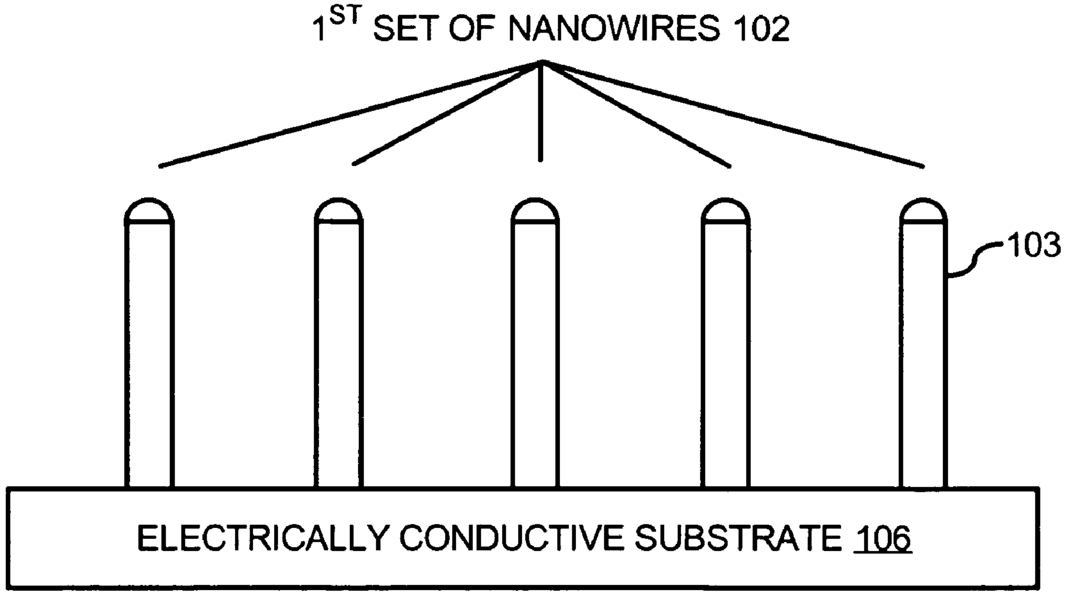
FIGS. 2A-E collectively illustrate a method of forming an apparatus having two sets of interdigitated nanowires, according to an embodiment of the invention.

FIGS. 2A-E collectively illustrate a method of forming the apparatus 100 depicted in FIG. 1, according to an embodiment. FIGS. 2A-E also depict some of the elements with different types of shading to better distinguish the different elements from each other. In FIG. 2A, the first set of nanowires 102 is provided on the electrically conductive substrate 106. In one embodiment, the first set of nanowires 102 may be grown on the electrically conductive substrate 106 as discussed above. Similarly, as previously set forth, the first set of nanowires 102 may be formed from any reasonably suitable materials or combination of materials, and may be selectively doped or coated with any reasonably suitable material or combination of materials. For instance, the nanowires 103 of the first set of nanowires 102 may have functionalized regions, such as those described in U.S. patent application Ser. No. TBD, filed on TBD, which is hereby incorporated by reference in its entirety.

Figure 2B:
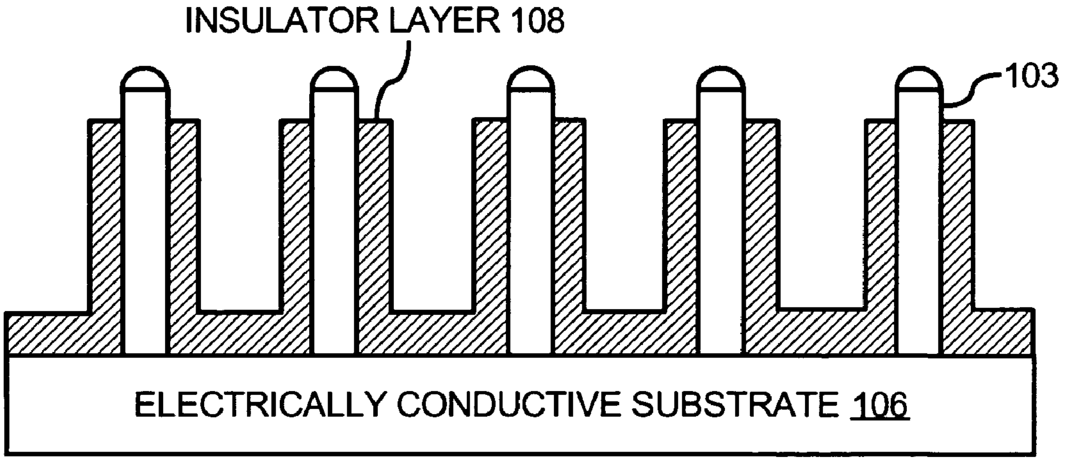

In FIG. 2B, the insulator layer 108 may be deposited on the electrically conductive substrate 106 and at least portions of the first set of nanowires 102 through, for instance, CVD, PVD, ALD, electrodeposition, electroless deposition, etc. According to an embodiment, the insulator layer 108 may be grown from a material, such as silicon, provided on the electrically conductive substrate 106 and portions of the first set of nanowires 102, and the material may be oxidized to form an oxide, such as silicon dioxide. According to another embodiment, the insulator layer 108 may be deposited using any of the deposition techniques discussed above.

In any regard, the insulator layer 108 may be selectively applied to portions of the first set of nanowires 102 or the insulator layer 108 may be deposited over all surfaces of the electrically conductive substrate 106 and the first set of nanowires 102. If the insulator layer 108 is coated over the entire surface of the electrically conductive substrate 106 and the first set of nanowires 102, the insulator layer 108 may be removed from portions of the electrically conductive substrate 106 or the first set of nanowires 102, such as from portions of the terminal ends of the nanowires of the first set of nanowires 102, opposite the electrically conductive substrate 106 through etching, polishing, or the like.

Figure 2C:
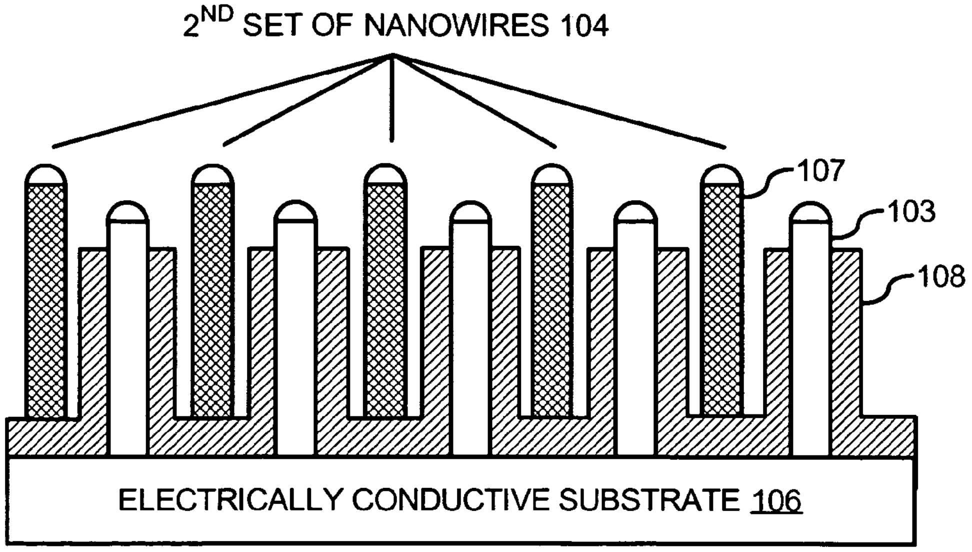

In FIG. 2C, the second set of nanowires 104 is provided on the insulator layer 108. The second set of nanowires 104 may be grown or deposited on the insulator layer 108, through, for instance, the same methods discussed above with respect to the first set of nanowires 102. In addition, the material used to create the second set of nanowires 104 may be the same as, or may differ from, the first set of nanowires 102, and may include any of the materials discussed above. The second set of nanowires 104 may not have the ordered configuration depicted in FIG. 1 because the insulator layer 108 may comprise an amorphous substrate.

Figure 2D:
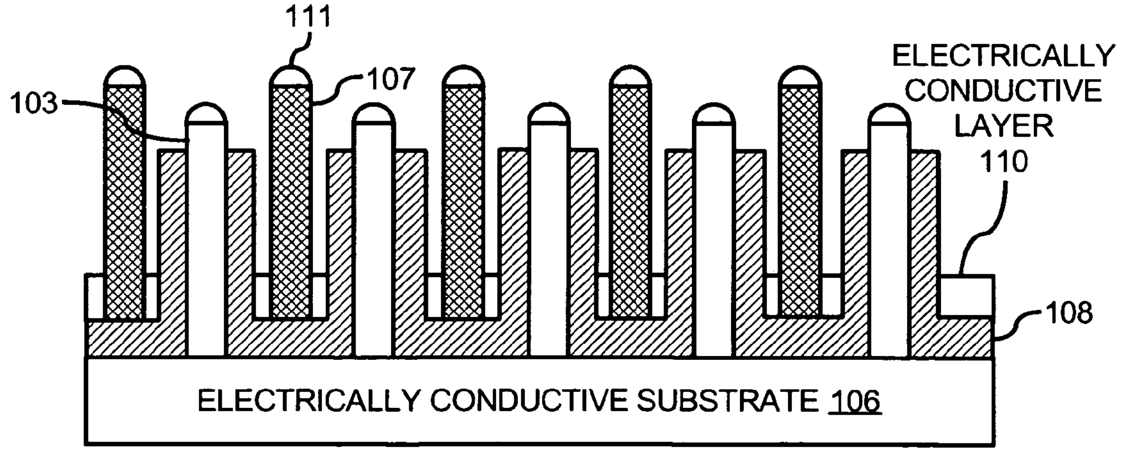

In FIG. 2D, the electrically conductive layer 110 is deposited on the insulator layer 108. The electrically conductive layer 110 may coat all of surfaces of the insulator layer 108, and may also coat the second set of nanowires 104. However, the terminal ends 111 of the nanowires 107 of the second set of nanowires 104, opposite the insulator layer 108, may remain uncoated by the electrically conductive layer 110. Alternatively, the terminal ends 111 of the nanowires of the second set of nanowires 104 may be etched or polished to remove any electrically conductive layer 110 deposited thereon.

According to another embodiment, the steps depicted in FIGS. 2C and 2D may be reversed. In this embodiment, the electrically conductive layer 110 may be deposited onto the insulator layer 108 and the second set of nanowires 104 may be grown on the electrically conductive layer 110 or otherwise deposited onto the electrically conductive layer 110. By growing the second set of nanowires 104 on the electrically conductive layer 110, the ordered configuration of the nanowires depicted in FIG. 1 may more readily be achieved.

Figure 2E:
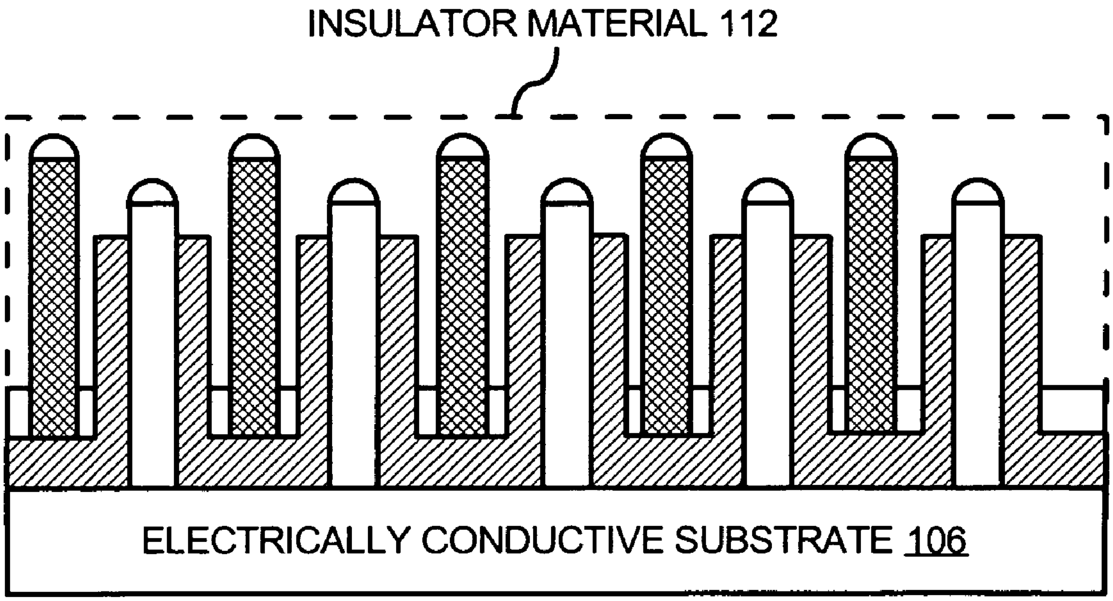

FIG. 2E illustrates an optional step of covering the apparatus 100 in an insulator material 112. The insulator material 112 may be any reasonably suitable material or combination of materials, such as silicon dioxide, nitride, aluminum oxide, etc. The insulator material 112 may be used to provide a protective coating over the apparatus 100. In addition, the insulator material 112 may be removed from portions of the apparatus 100, such as the terminal ends of the first and second sets of nanowires 102 and 104 by any reasonably suitable method, such as through polishing and/or etching.

Figure 3:
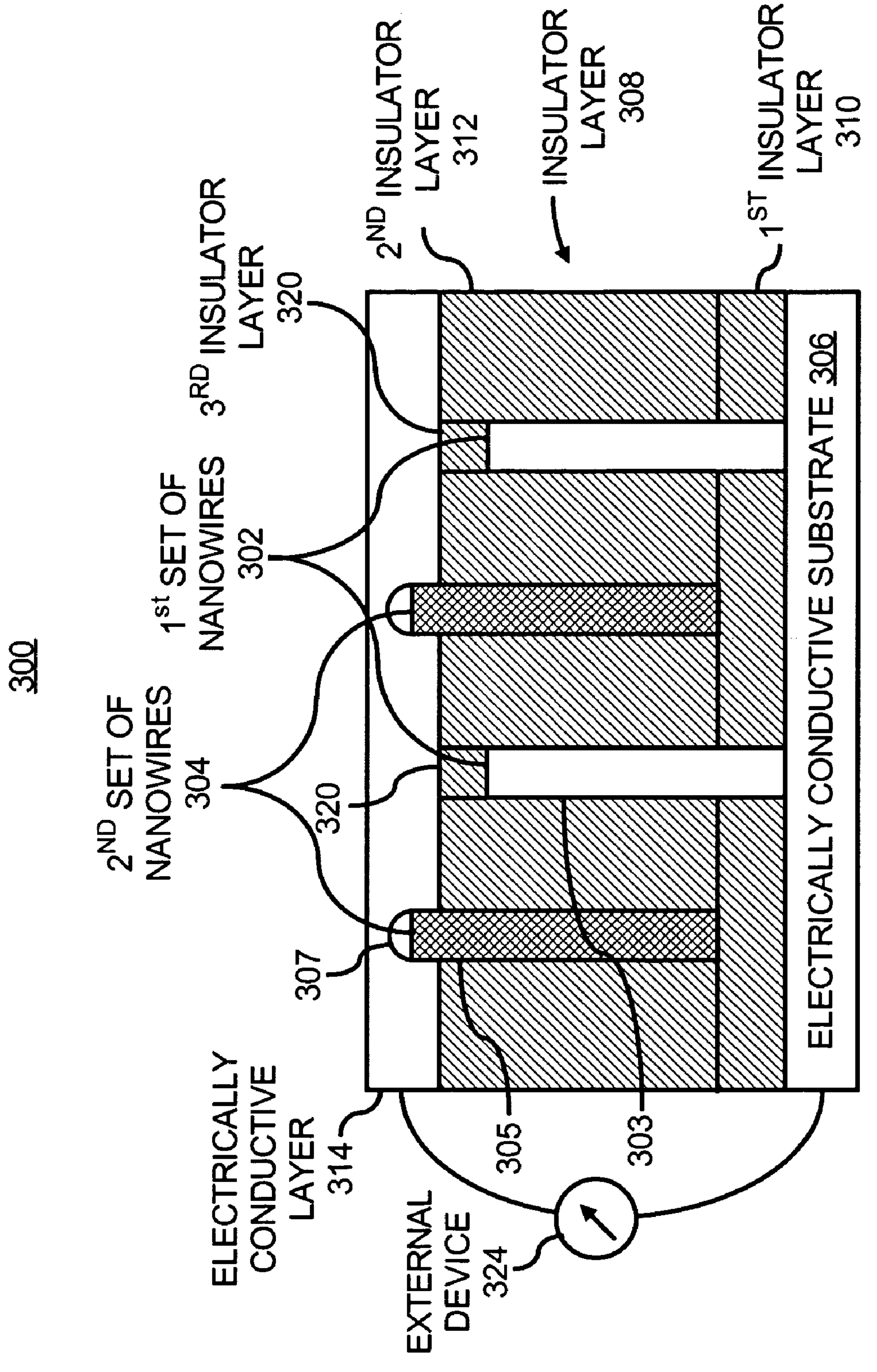
FIG. 3 illustrates an apparatus having two sets of independently addressable interdigitated nanowires, according to another embodiment of the invention.

Turning now to FIG. 3, there is illustrated a cross-sectional side view of an apparatus 300 having two sets of interdigitated nanowires, where one set of nanowires is independently addressable from the other set of nanowires, according to another embodiment. Some of the elements in FIG. 3 are depicted with different types of shading to better distinguish the different elements from each other. The apparatus 300 may include additional components and some of the components described herein may be removed and/or modified without departing from a scope of the apparatus 300.

As shown, the apparatus 300 includes a first set of nanowires 302 and a second set of nanowires 304. The first set of nanowires 302 and the second set of nanowires 304 are interdigitated with each other in a regular "one for one" alternating pattern along the horizontal axis of the apparatus 300. However, a person having ordinary skill in the art will appreciate that the first and second sets of nanowires 302 and 304 may be interdigitated in any regular or irregular manner, as set forth above.

According to the embodiment depicted in FIG. 3, the first set of nanowires 302 extends from an electrically conductive substrate 306. The electrically conductive substrate 306 may be any material, which conducts an electric current similar to the electrically conductive substrate 106 discussed above.

The electrically conductive substrate 306 generally enables electrical communication between the nanowires 303 of the first set of nanowires 302. That is, an electric current may flow from one nanowire 303 of the first set of nanowires 302 to all the other nanowires 303 of the first set of nanowires 302.

An insulator layer 308 is provided on the electrically conductive substrate 306. The insulator layer 308 may be any material, which inhibits the flow of an electric current and may be similar to the insulator layer 108 discussed above. In addition, the insulator layer 308 may be formed of a first insulator layer 310 and a second insulator layer 312, as described herein below.

The apparatus 300 also includes a second set of nanowires 304, which is substantially encapsulated in the insulator layer 308, but extends beyond the insulator layer 308. According to an embodiment, the nanowires 305 of the second set of nanowires 304 may be formed from different materials or different combinations of materials than the materials used to form the nanowires 303 of the first set of nanowires 302. For example, the first set of nanowires 302 may be substantially metallic, while the second set of nanowires 304 may be formed from a semiconductor material, such as silicon, doped silicon, germanium or doped germanium. According to another embodiment, the nanowires 305 of the second set of nanowires 304 may comprise the same or similar materials as the nanowires 303 of the first set of nanowires 302.

The apparatus 300 also includes an electrically conductive layer 314 disposed along the uppermost portion of the apparatus 300. The electrically conductive layer 314 generally allows the nanowires 305 of the second set of nanowires 304 to be in electrical communication with each other. That is, an electric current may flow from one nanowire 305 of the second set of nanowires 304 to all the other nanowires 305 of the second set of nanowires 304.

The first and second sets of nanowires 302 and 304 may be brought into electrical communication with each other by an external device 324. The external device 324 includes any material or instrument capable of facilitating an electrical connection between the first and second sets of nanowires 302 and 304, thereby allowing an electric current to pass between the first and second sets of nanowires 302 and 304. The external device 324 may also include any device capable of measuring an electrical property of the first and second set of nanowires 302 and 304. Other devices, such as driving power sources, amplifiers, analyzers, etc. may also be used in conjunction with the apparatus 300. The apparatus 300 may, for instance, include a computer or any device used in probe stations.

FIGS. 4A-G collectively illustrate a method of forming the apparatus 300 depicted in FIG. 3, according to an embodiment. Some of the elements in FIG. 4 are depicted with different types of shading to better distinguish the different elements from each other.

Figure 4A:
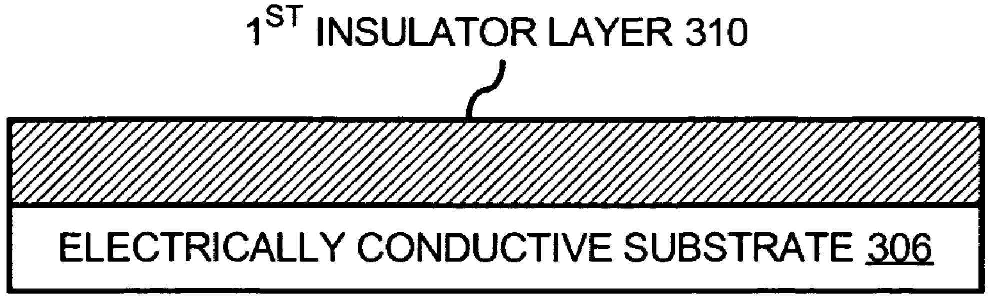
FIGS. 4A-G collectively illustrate a method of forming an apparatus having two sets of independently addressable interdigitated nanowires, according to another embodiment of the invention.

In FIG. 4A, a first layer of insulator layer 310 is provided on the electrically conductive substrate 306. The first insulator layer 310 and the electrically conductive substrate 306 may be formed from any reasonably suitable materials and may be provided in the layered relationship illustrated in FIG. 4A by any reasonably suitable manner. For example, the first insulator layer 310 and the electrically conductive substrate 306 may be fused or bonded together. As another example, the first insulator layer 310 may be grown on top of the electrically conductive substrate 306. As a further example, the first insulator layer 310 may be deposited onto the electrically conductive substrate 306.

Figure 4B:
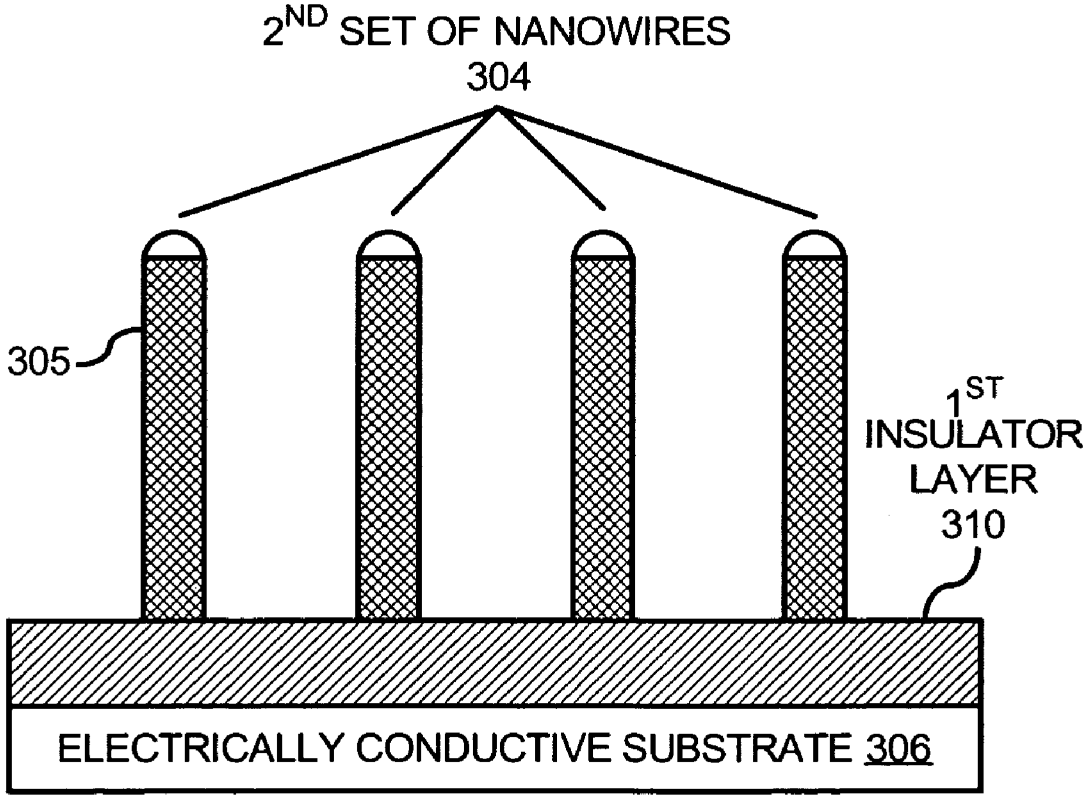

In FIG. 4B, the nanowires 305 of the second set of nanowires 304 are grown or deposited on the first insulator layer 310. The nanowires 305 may be grown or deposited by any reasonably suitable method and with any reasonably suitable materials, including those methods and materials referenced above. Similarly, as previously set forth, the nanowires 305 may be formed from any materials or combinations of materials, and may be selectively doped or coated with any material or combination of materials. Because the insulator layer 310 may comprise an amorphous substrate, the second set of nanowires 304 may not have the ordered configuration depicted in FIG. 3. In addition, if the nanowires 305 are deposited onto the first insulator layer 310, the nanowires 305 may be deposited as a layer and may be patterned and etched to form the nanowires 305.

Figure 4C:
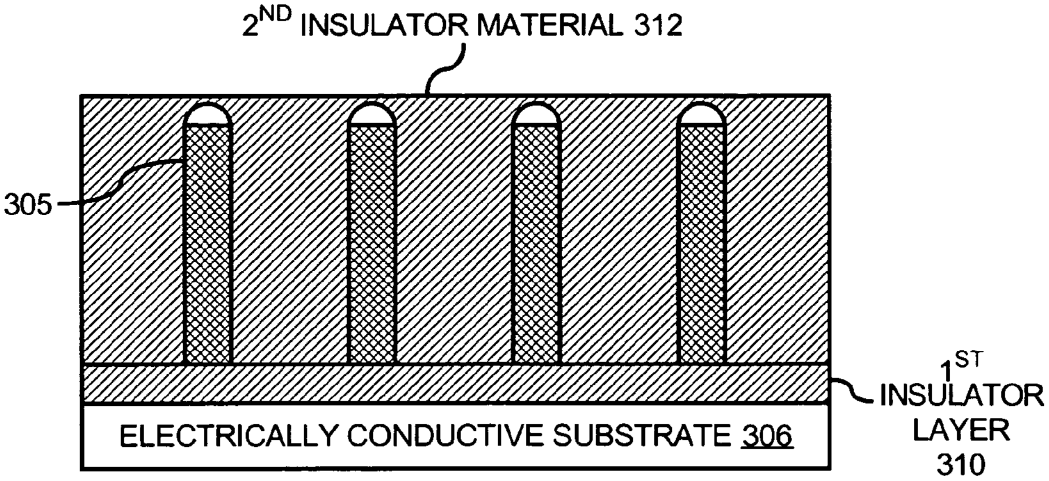

In FIG. 4C, a second insulator layer 312 is provided on top of the first insulator layer 310 and encapsulates the second set of nanowires 304. In one embodiment, the second insulator layer 312 includes the same material used to form the first insulator layer 310. In another embodiment, the second insulator layer 312 includes a material that is different from the first insulator layer 310. In any regard, the second insulator layer 312 may be deposited or grown on the first insulator layer 310 in manners as discussed above with respect to the first insulator layer 310.

Figure 4D:
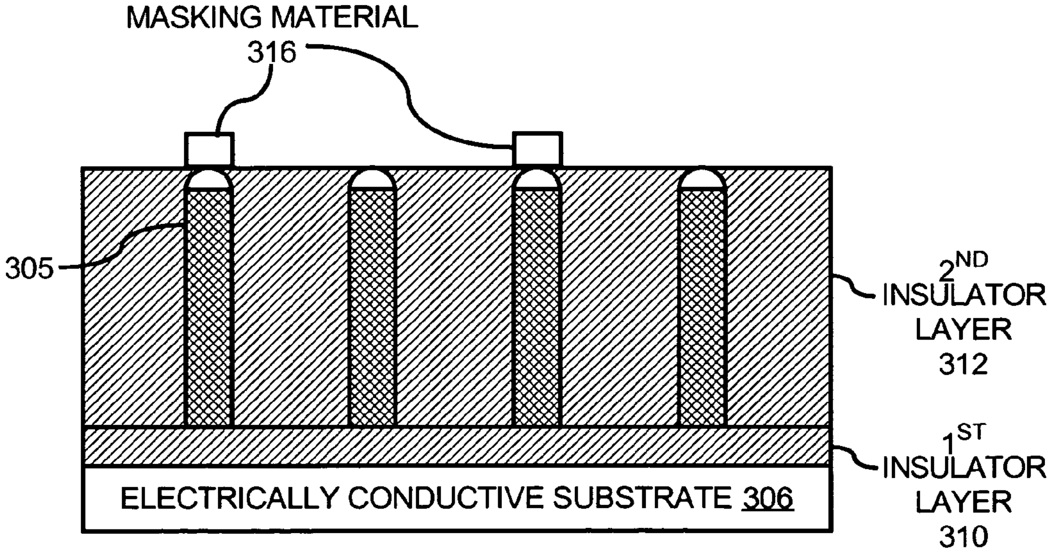

In FIG. 4D, at least one nanowire 305 of the second set of nanowires 304 is masked with a masking material 316, which may be any reasonably suitable masking material that is capable of shielding another material from an etching process. In addition, any reasonably suitable number of nanowires 305 may be masked in any reasonably suitable configuration, such as 50% of the nanowires 305 in the second set of nanowires 304 in an alternating manner, as shown in FIG. 4D. Moreover, although it is not shown in FIG. 4D, portions of the second insulator layer 312 may also be masked with the masking material 316.

Figure 4E:
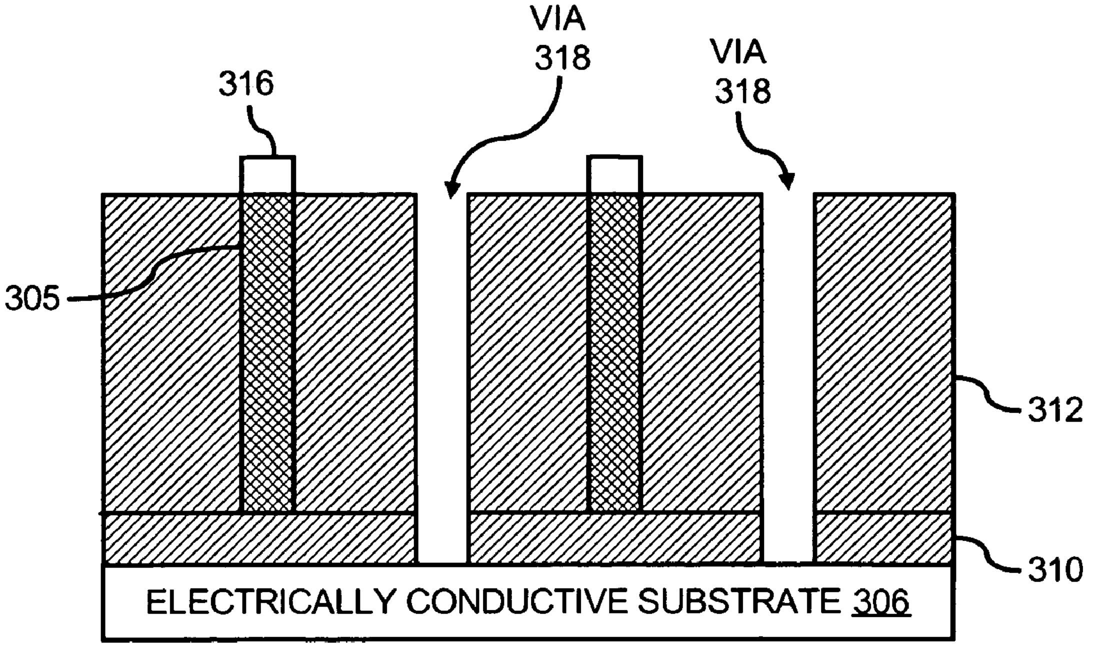

In FIG. 4E, the unmasked nanowires 305 of the second set of nanowires 304 are subjected to an etching process to remove the unmasked nanowires 305 of the second set of nanowires 304 and the portions of the first insulator layer 310 below the unmasked nanowires 305. Thus, vias 318 are created in the unmasked portions and the electrically conductive substrate 306 is exposed at the bottom of the vias 318.

In addition or alternatively, and according to another embodiment, instead of positioning the masking material 316 over select nanowires 305 of the second set of nanowires 304, the masking material 316 may be positioned over areas of the insulator layer 308 that are to remain following an etching process of the insulator layer 308. In this embodiment, therefore, parts of the second insulator layer 312 and the first insulator layer 310 are etched away to form the vias 318. In a yet further embodiment, the masking material 316 may be positioned over both selected nanowires 305 and various sections of the insulator layer 308.

Figure 4F:
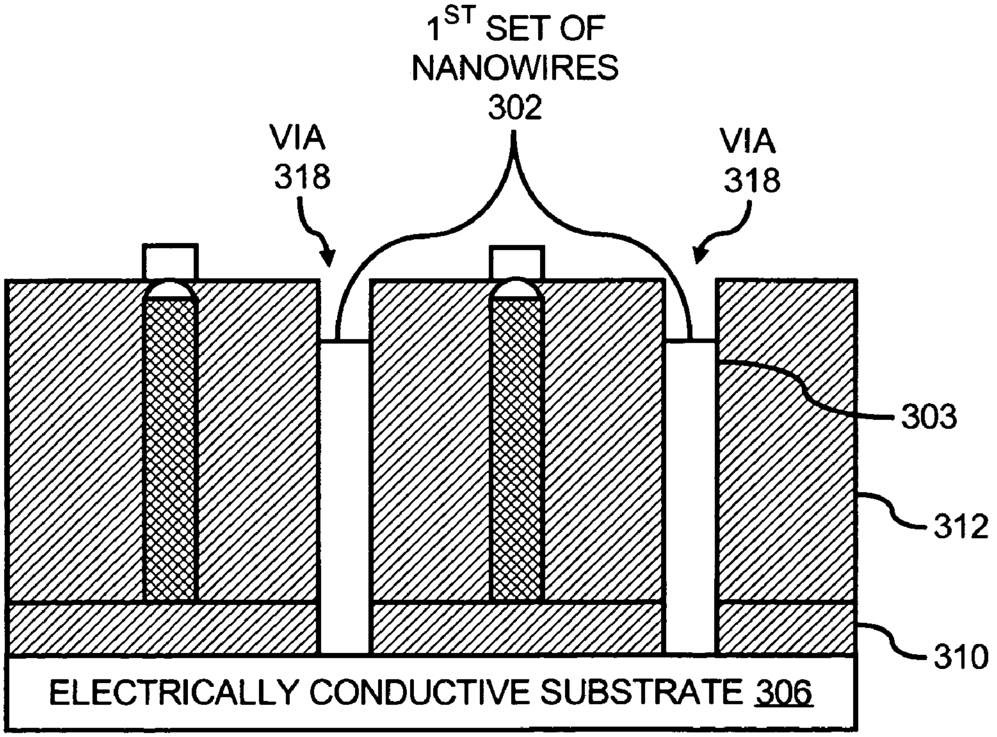

In FIG. 4F, a material is deposited or grown in the vias 318 to create the first set of nanowires 302. Any reasonably suitable material or combination of materials may be deposited or grown in the vias 318 to create the first set of nanowires 302, by any reasonably suitable method, including atomic layer deposition, wet chemistry procedures, electrodeposition, electroless deposition, CVD, PVD, etc. Because the nanowires 303 are connected to the electrically conductive substrate 306, the first set of nanowires 302 may be in electrical communication with each other, as described above.

Figure 4G:
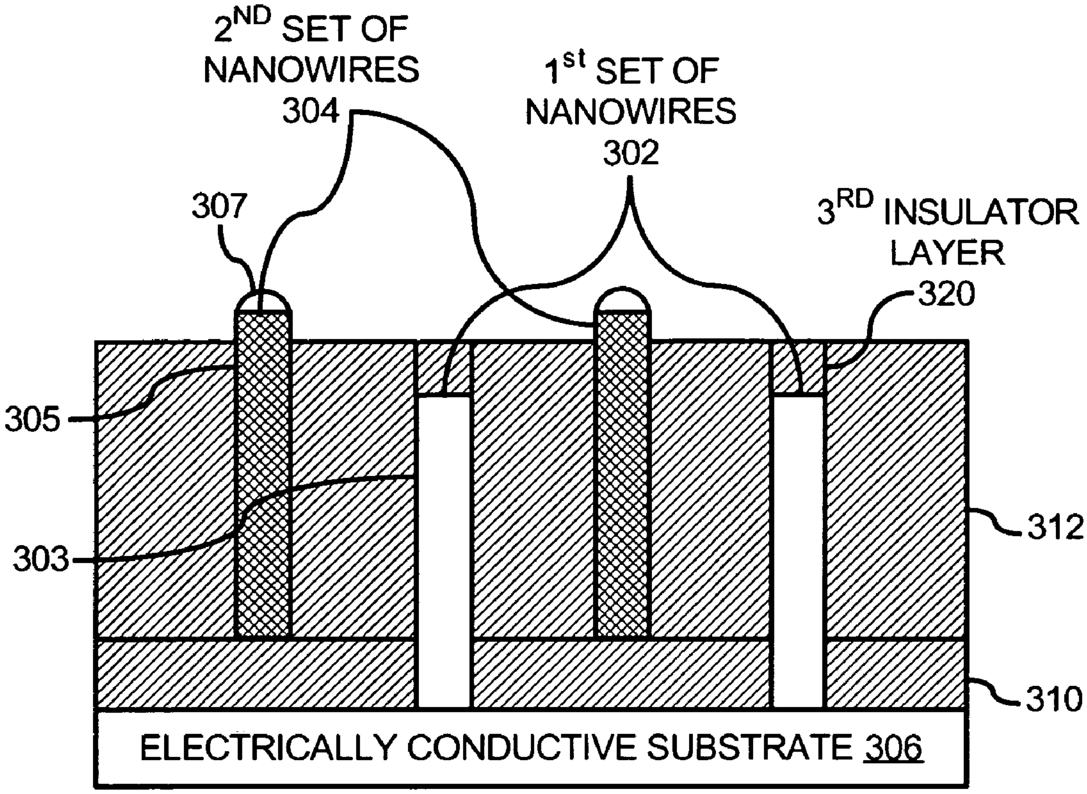

In FIG. 4G, the masking material 316 is removed and a portion of the second insulator layer 312 may also be removed. The portions of the second insulator layer 312 may be removed to expose the terminal ends of the second set of nanowires 304. The steps of removing the masking material 316 and removing portions of the second insulator layer 312 may occur in any order, or may be performed substantially simultaneously.

In FIG. 4G a third insulator layer 320 may be provided, through deposition or growth, in the vias 318 over the first set of nanowires 302. This step, however, may be unnecessary if it is determined that there is sufficient space between the terminal ends of the first set of nanowires 303 and the electrically conductive layer 314 (FIG. 3) to keep them from being electrically connected to each other. In either regard, the electrically conductive layer 314 may be added over the insulator layer 308 to contact the uppermost terminal ends 307 of the second set of nanowires 304 as shown in FIG. 3. The electrically conductive layer 314 may include any reasonably suitable material, including silicon, doped silicon, germanium, or metal and may be disposed on the insulator layer 308 by any reasonably suitable method. The first and second sets of nanowires 302 and 304 are independently addressable, because the two sets of nanowires 302 and 304 are electrically isolated from each other due to the placement of the insulator layer 308 between the electrically conductive layer 310 and the first set of nanowires 302.

Figure 5A:
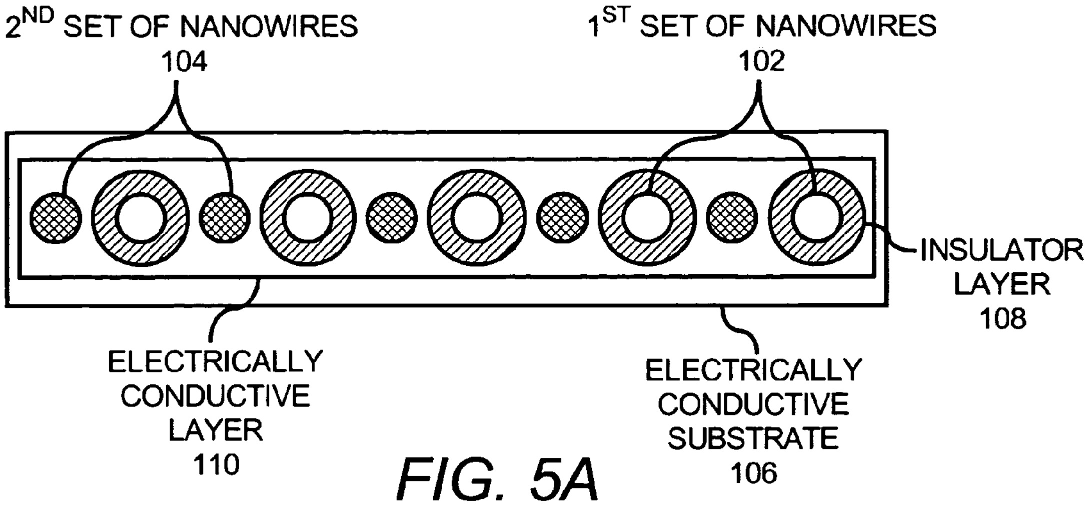
FIGS. 5A and 5B illustrate geometrical spacing of nanowires in an apparatus having two sets of independently addressable interdigitated nanowires, according to an embodiment of the invention.
Figure 5B:
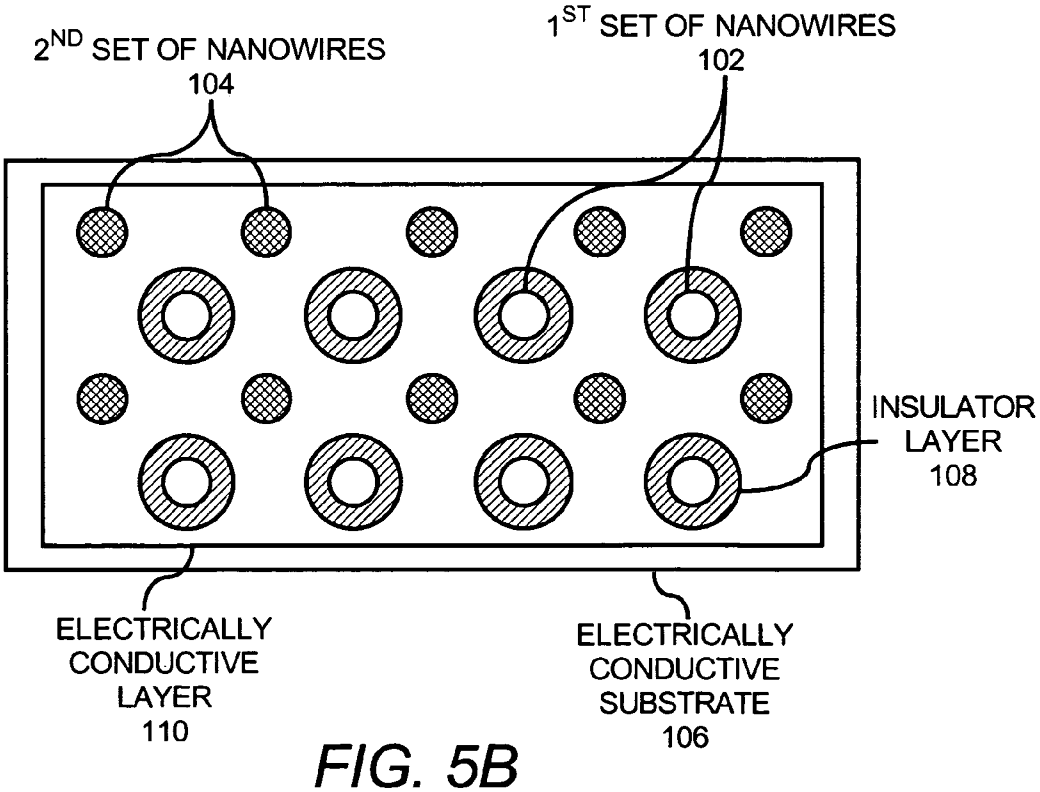

FIGS. 5A and 5B illustrate respective geometrical spacings of the nanowires 103 and 107 in the apparatus 100 of FIG. 1, according to two embodiments. More particularly, FIGS. 5A and 5B may represent alternate top views of the apparatus 100.

FIG. 5A shows a simplified version of the apparatus 100 having a single row of interdigitated nanowires 103, 107, while FIG. 5B shows a more complex version of the apparatus 100 having multiple rows of interdigitated nanowires 103, 107. In FIGS. 5A and 5B, the first and second sets of nanowires 102, 104 are configured in an alternating “one-for-one” regularly repeating pattern. In addition, the first and second sets of nanowires 102, 104 are aligned in a substantially linear relationship.

Figure 5C:
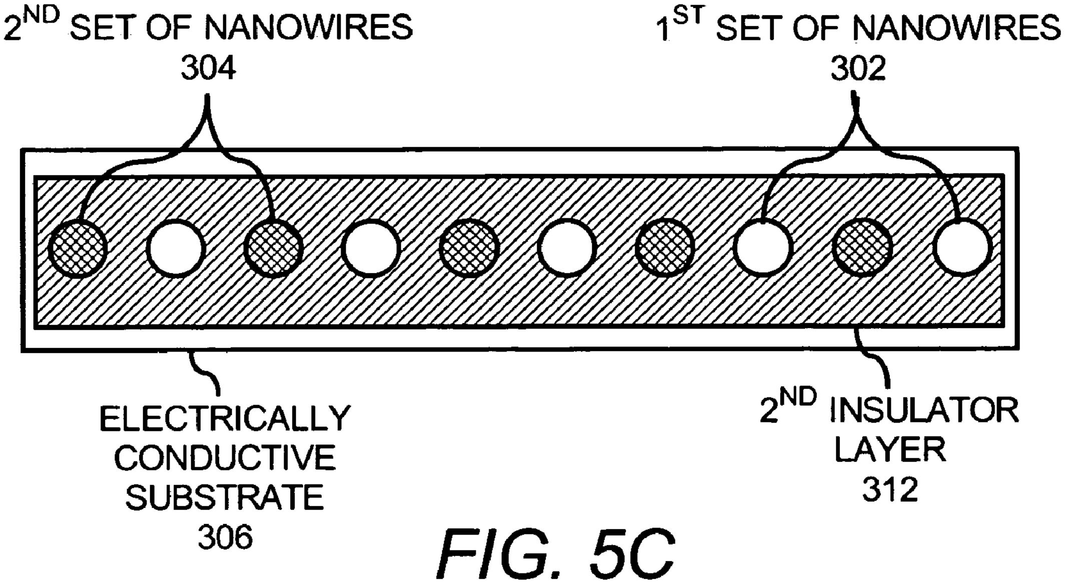
FIGS. 5C and 5D illustrate geometrical spacing of nanowires in an apparatus having two sets of independently addressable interdigitated nanowires, according to another embodiment of the invention.
Figure 5D:
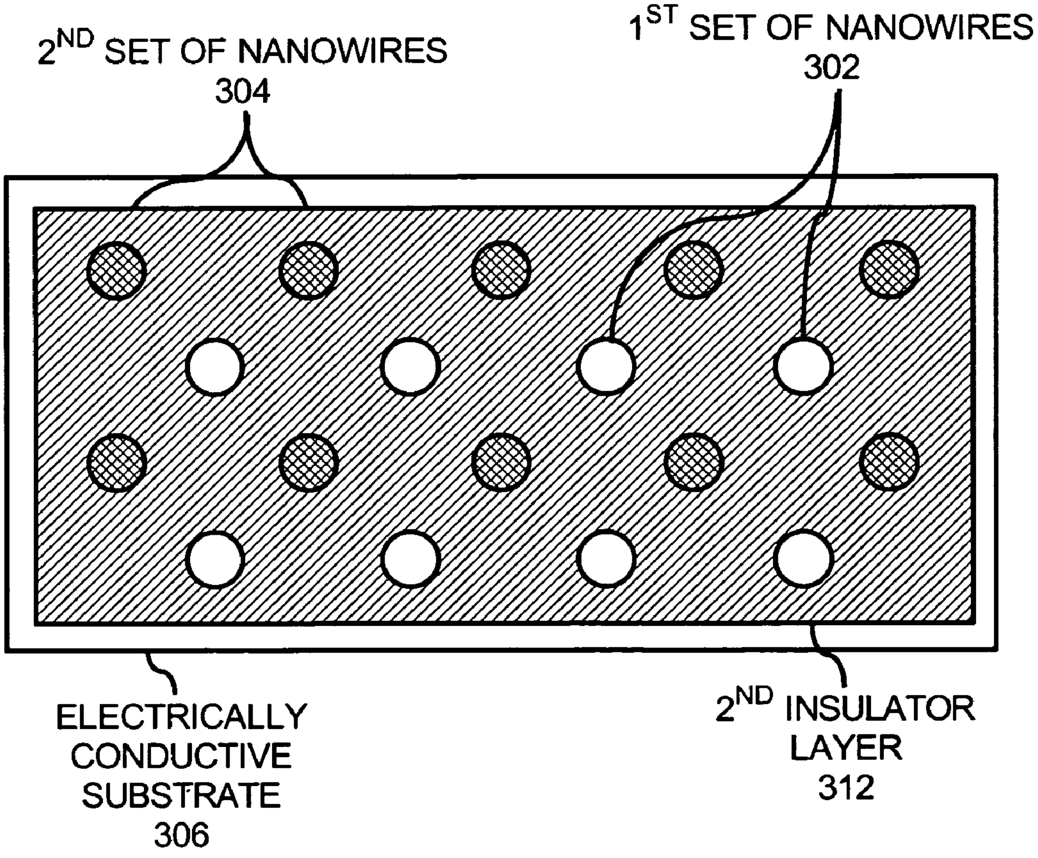

FIG. 5C shows a simplified cross-sectional view taken along a horizontal center axis of the apparatus 300 depicted in FIG. 3 having a single row of interdigitated nanowires 303, 305, while FIG. 5D shows a more complex version of the cross-sectional view of the apparatus 300 having multiple rows of interdigitated nanowires 303, 305. In FIGS. 5C and 5D, the first and second sets of nanowires 302, 304 are configured in an alternating “one-for-one” regularly repeating pattern. In addition, the first and second sets of nanowires 302, 304 are aligned in a substantially linear relationship.

According to another embodiment, and with respect to FIGS. 5A-5D, the first and second sets of nanowires 102, 104 and 302, 304 may be interdigitated in any configuration or pattern, including substantially linear, offset, or random. For example, a series of nucleation sites may be formed in a substantially random pattern using electron beam lithography, and the nanowires may be grown from the randomly laid nucleation sites. Alternatively, the first and second sets of nanowires 102, 104 and 302, 304 may be provided in a precise, complex geometric configuration to provide the apparatuses 100 and 300 with selective functionality and/or flexibility. For example, the first and second sets of nanowires 102, 104 and 302, 304 may be provided in a zebra pattern, checkerboard pattern, and the like.

The interdigitated sets of independently addressable nanowires described herein, such as the apparatuses 100 and 300, may be used in a dipole antenna array for sending or receiving signals. For example, the interdigitated sets of independently addressable nanowires may be used in a phase array antenna device where phase shift between the two interdigitated sets of nanowires create the phase array. The apparatuses 100 and 300 are particularly useful for creating devices used as dipole antenna arrays because the methods of making the apparatuses 100 and 300 allow for a large number of independently addressable sets of interdigitated nanowires to be created on a small substrate, thus obtaining a high surface density of nanowires and an efficient antenna.

The interdigitated sets of independently addressable nanowires described herein may also be used in sensor arrays and devices. For example, the apparatuses 100 and 300 may be used as biological, chemical, mechanical, electrical, etc., sensors.

Figure 6:
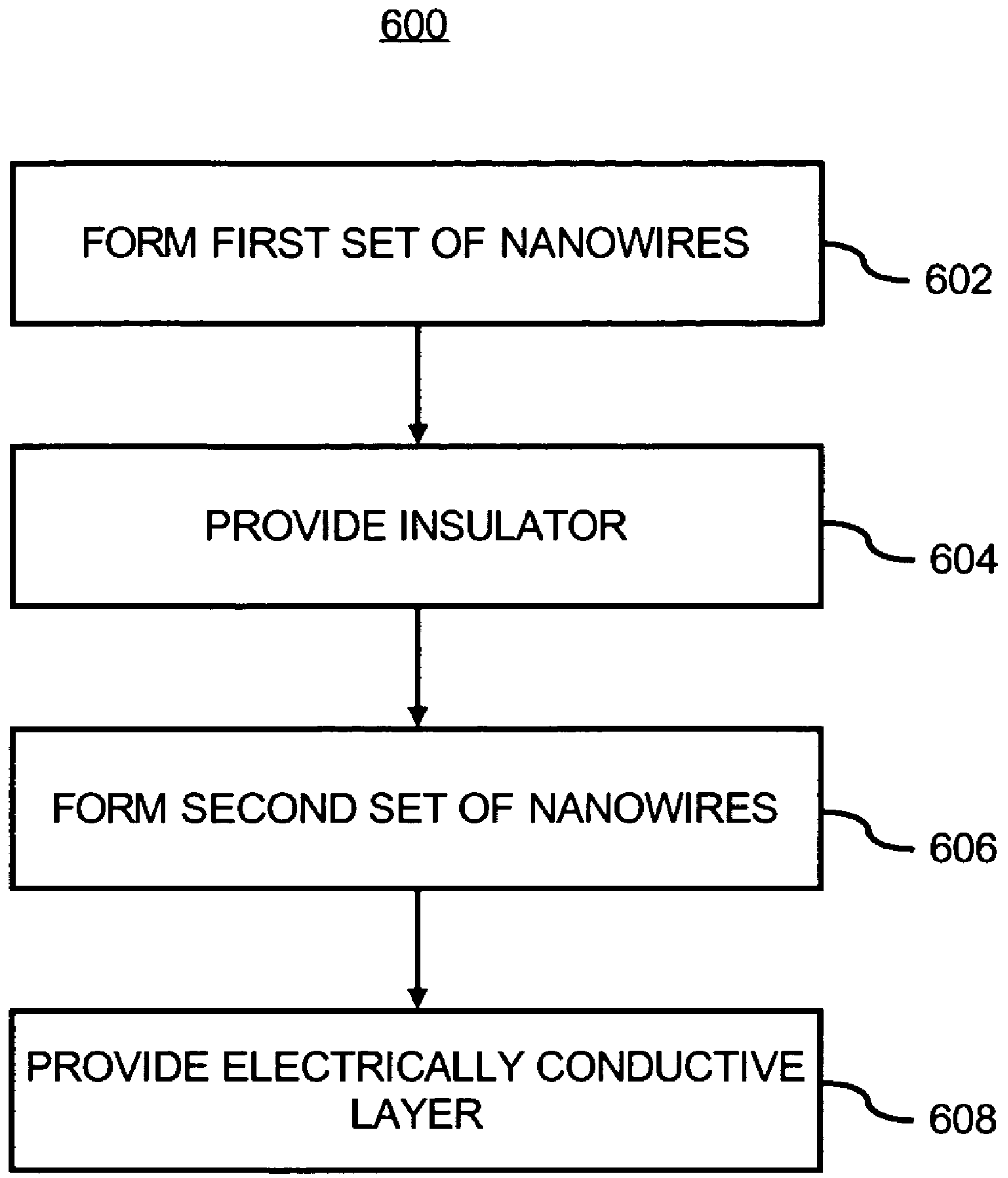
FIG. 6 illustrates a flowchart of a method of forming an apparatus having two sets of independently addressable interdigitated nanowires, according to an embodiment of the invention.

FIG. 6 illustrates a flow chart of a method 600 of forming an apparatus 100 having multiple sets of interdigitated nanowires, where each set of nanowires is independently addressable from each other set of nanowires, according to an embodiment. For example, the method 600 may be used to form the apparatus 100, illustrated in FIG. 1. Therefore, the method 600 is described with respect to FIG. 1, FIGS. 2A-E, and FIGS. 5A and 5B by way of example and not of limitation. A person having ordinary skill in the art will appreciate that additional steps may be added to the method 600 and, similarly, that some of the steps outlined in FIG. 6 may be omitted, changed, or rearranged without departing from a scope of the method 600.

At step 602, a first set of nanowires 102 is formed on an electrically conductive substrate 106. At step 604, an insulator layer 108 is provided over the electrically conductive substrate 106 and portions of the first set of nanowires 102. At step 606, a second set of nanowires 104 is formed over the insulator layer 108. In addition, at step 608, an electrically conductive layer 110 is provided to electrically connect the second set of nanowires 104. As discussed above, however, steps 606 and 608 may be reversed, such that the electrically conductive layer 110 is deposited or grown on the insulator layer 108 prior to growth or deposition of the second set of nanowires 104.

Figure 7:
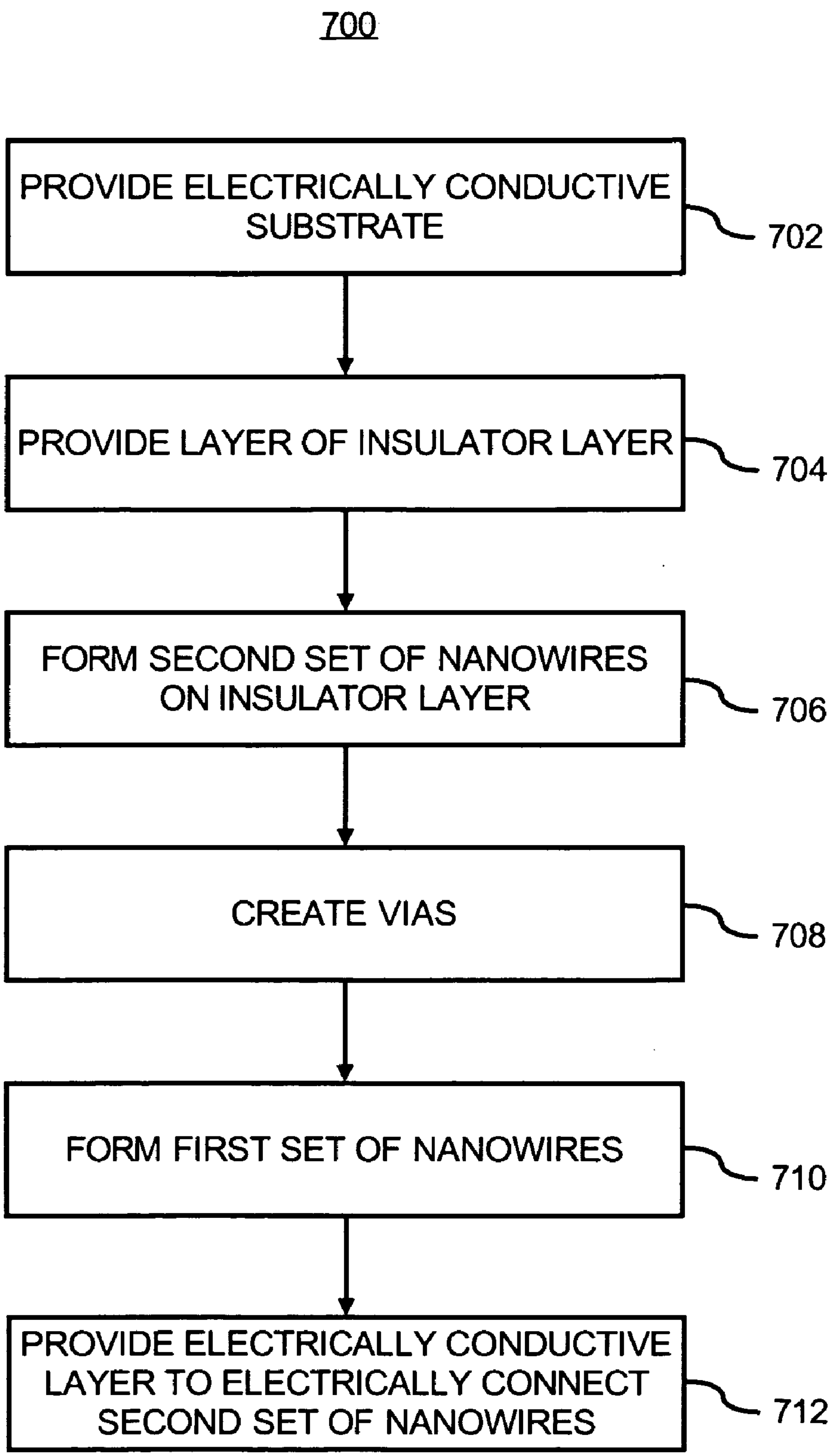
FIG. 7 illustrates a flowchart of a method of forming an apparatus having two sets of independently addressable interdigitated nanowires, according to another embodiment of the invention.

FIG. 7 illustrates a flow chart of a method 700 of forming an apparatus 300 having multiple sets of interdigitated nanowires, where each set of nanowires is independently addressable from each other set of nanowires, according to an embodiment. For example, the method 700 may be used to form the apparatus 300, illustrated in FIG. 3. Therefore, the method 700 is described with respect to FIG. 3, FIGS. 4A-F, and FIGS. 5C and 5D by way of example and not of limitation. A person having ordinary skill in the art will appreciate that additional steps may be added to the method 700 and, similarly, that some of the steps outlined in FIG. 7 may be omitted, changed, or rearranged without departing from a scope of the method 700.

At step 702, an electrically conductive substrate 306 is provided. At step 704, a layer of insulator layer 310 is provided over the electrically conductive substrate 306. At step 706, a second set of nanowires 304 is formed over the layer of insulator layer 310. At step 708, vias 318 are created in portions of at least the layer of insulator layer 310 to expose portions of the electrically conductive substrate 306. At step 710, a first set of nanowires 302 are formed in the vias 318. In addition, at step 712, an electrically conductive layer 314 may be provided to electrically connect the second set of nanowires 304.

While the embodiments have been described with reference to examples, those skilled in the art will be able to make various modifications to the described embodiments. The terms and descriptions used herein are set forth by way of illustration only and are not meant as limitations. In particular, although the methods have been described by examples, steps of the methods may be performed in different orders than illustrated or simultaneously. Those skilled in the art will recognize that these and other variations are possible within the spirit and scope as defined in the following claims and their equivalents.

The invention claimed is:

1. An apparatus comprising:

a first set of nanowires; and a second set of nanowires interdigitated with the first set of nanowires, wherein the first set of nanowires and the second set of nanowires are formed of electrically conductive material, and wherein the first set of nanowires is independently electrically addressable and electrically isolated from the second set of nanowires.

2. The apparatus of claim 1, wherein nanowires of the first set of nanowires are electrically connected to other nanowires of the first set of nanowires and nanowires of the second set of nanowires are electrically connected to other nanowires of the second set of nanowires.

3. The apparatus of claim 1, further comprising:

an electrically conductive substrate;

an insulator layer disposed on the electrically conductive substrate; and an electrically conductive layer disposed on the insulator layer.

4. The apparatus of claim 3, wherein the first set of nanowires extends from the electrically conductive substrate and the second set of nanowires extends from the insulator layer, and wherein the insulator layer coats portions of the first set of nanowires.

5. The apparatus of claim 4, wherein the electrically conductive layer facilitates electrical connectivity between the nanowires of the second set of nanowires, and wherein the electrically conductive layer is electrically shielded from the nanowires of the first set of nanowires.

6. The apparatus of claim 4, wherein the first set of nanowires is substantially covered in the insulator layer and the second set of nanowires extends from the insulator layer and contacts the electrically conductive layer.

7. The apparatus of claim 3, wherein the second set of nanowires extends from the electrically conductive layer, such that the electrically conductive layer is positioned between the second set of nanowires and the insulator layer.

8. The apparatus of claim 1, wherein the first set of nanowires includes metallic nanowires.

9. The apparatus of claim 8, wherein the first set of nanowires is formed through at least one of a deposition of and a growth of a metallic material into a via formed through the insulator layer.

10. The apparatus of claim 1, wherein a portion of the second set of nanowires is covered by a masking material.

11. An antenna array comprising the apparatus of claim 1.

12. A sensor comprising the apparatus of claim 1.

13. A method comprising:

forming a first set of nanowires on an electrically conductive substrate;

providing an insulator layer on the electrically conductive substrate between the nanowires of the first set of nanowires, wherein the insulator layer partially coats the nanowires of the first set of nanowires;

forming a second set of nanowires on the insulator layer, wherein the nanowires of the second set of nanowires are interdigitated with the nanowires of the first set of nanowires, wherein the first set of nanowires and the second set of nanowires are formed of electrically conductive material; and providing an electrically conductive layer on the insulator layer, wherein the electrically conductive layer electrically connects the nanowires of the second set of nanowires with each other.

14. The method of claim 13, wherein providing an insulator layer further comprises:

insulating the first set of nanowires from the second set of nanowires such that the first set of nanowires is independently addressable from the second set of nanowires.

15. The method of claim 13, further comprising:

providing another insulator layer over the first and second sets of nanowires; and at least one of etching and polishing the another insulator layer.

16. The method of claim 13, further comprising:

providing the electrically conductive layer on the insulator layer prior to forming the second set of nanowires, and wherein forming the second set of nanowires comprises forming the second set of nanowires on the electrically conductive layer.

17. A method comprising:

providing an insulator layer on an electrically conductive substrate;

forming a second set of nanowires on the insulator layer;

providing a second insulator layer on the insulator layer between nanowires of the second set of nanowires;

creating vias in the insulator layer and the another insulator layer, wherein the vias expose portions of the electrically conductive substrate; and forming a first set of nanowires in the vias, wherein nanowires of the first set of nanowires are electrically connected to other nanowires of the first set of nanowires through the electrically conductive substrate, wherein the first set of nanowires and the second set of nanowires are formed of electrically conductive material.

18. The method of claim 17, further comprising;

depositing a third insulator layer over the nanowires of the second set of nanowires; and providing an electrically conductive layer over the second insulator layer and the third insulator layer, wherein the electrically conductive layer electrically connects the nanowires of the second set of nanowires with each other.

19. The method of claim 17, wherein creating vias further comprises:

masking a portion of at least one of the nanowires of the second set of nanowires and the insulator material; and etching portions of at least the second insulator layer to thereby create the vias.

20. The method of claim 19, wherein etching portions of the at least the second insulator layer further comprises:

etching at least one nanowire of the second set of nanowire to create at least one of the vias.

* * * * *